United States Patent
Kuan (10) Patent No.: US 9,831,880 B1
(45) Date of Patent: Nov. 28, 2017

(54) SYSTEMS AND METHODS FOR AUTOMATIC BANDWIDTH AND DAMPING FACTOR OPTIMIZATION OF CIRCUITS

(71) Applicant: Taiwan Semiconductor Manufacturing Company Limited, Hsinchu (TW)

(72) Inventor: Ting-Kuei Kuan, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/220,464

(22) Filed: Jul. 27, 2016

(51) Int. Cl.
- H03D 3/24 (2006.01)
- H03L 7/08 (2006.01)
- H03L 7/093 (2006.01)
- H03L 7/099 (2006.01)
- H04L 7/033 (2006.01)

(52) U.S. Cl.
CPC ............ H03L 7/0807 (2013.01); H03L 7/093 (2013.01); H03L 7/0991 (2013.01); H04L 7/0331 (2013.01); *H03L 2207/04* (2013.01)

(58) Field of Classification Search
CPC ..... H03L 7/093; H03L 7/085; H03L 2207/50; H03L 7/08; H03M 7/3004
USPC ........ 375/376, 371, 373; 327/156, 105, 107, 327/141, 147; 341/155; 455/260, 76
See application file for complete search history.

(56) References Cited

U.S. PATENT DOCUMENTS

| | | | |
|---|---|---|---|
| 2005/0069055 A1* | 3/2005 | Song | H04L 27/22 375/324 |
| 2006/0221242 A1* | 10/2006 | Huang | H03L 7/08 348/572 |
| 2008/0240295 A1* | 10/2008 | Kim | H04L 27/066 375/321 |
| 2013/0010810 A1* | 1/2013 | Pelet | H04B 1/1036 370/479 |

* cited by examiner

Primary Examiner — Leila Malek
(74) Attorney, Agent, or Firm — Jones Day (57) ABSTRACT

Systems and methods for automatically controlling one or more parameters of a digital phase-locked loop (DPLL) circuit are provided. A phase error signal generated by a phase detector of the DPLL circuit is received. A delayed version of the phase error signal is generated. A product of the phase error signal and the delayed version of the phase error signal is generated. The product is integrated, and a first output for controlling a gain of a proportional path of the DPLL circuit is generated based on the integrated product. The first output is down-sampled. A least-mean-square (LMS) filter is used to generate a second output that minimizes a value of the down-sampled output. A gain of an integral path of the DPLL is controlled based on the second output.

20 Claims, 12 Drawing Sheets

SYSTEMS AND METHODS FOR AUTOMATIC BANDWIDTH AND DAMPING FACTOR OPTIMIZATION OF CIRCUITS

BACKGROUND

Phase-locked loop (PLL) circuits are commonly used in circuits and systems that output a high-frequency signal, with a frequency of the output signal being a multiple of a frequency of a reference signal. PLL circuits are also found in applications where a phase of the output signal must track a phase of the reference signal. As an example, a PLL circuit can be used in a radio receiver or transmitter to generate a local oscillator signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The approaches of the instant disclosure provide systems and methods for dynamically controlling the bandwidth and damping factor of digital phase-locked loops (DPLLs), digital clock and data recovery (CDR) circuits, and digital delay-locked loops (DLLs), among others. As described below, such systems and methods are used to lower phase noise and jitter of a DPLL, CDR, or DLL over different process, supply voltage, and temperature (PVT) conditions and different environmental conditions (e.g., noise, etc.). In embodiments, the systems and methods provide a two-degree control technique for controlling the bandwidth and damping factor of a DPLL, CDR, or DLL, whereby (i) a gain of a proportional path of the DPLL, CDR, or DLL, and (ii) a gain of an integral path of the DPLL, CDR, or DLL are selected and dynamically adjusted (e.g., to minimize jitter of the circuit, etc.). The selection and dynamic adjustment of these gain values are performed automatically and in a manner that requires no human intervention (e.g., manual intervention) or only minimal human intervention. Such embodiments are explained in greater detail below.

Figure 1A:
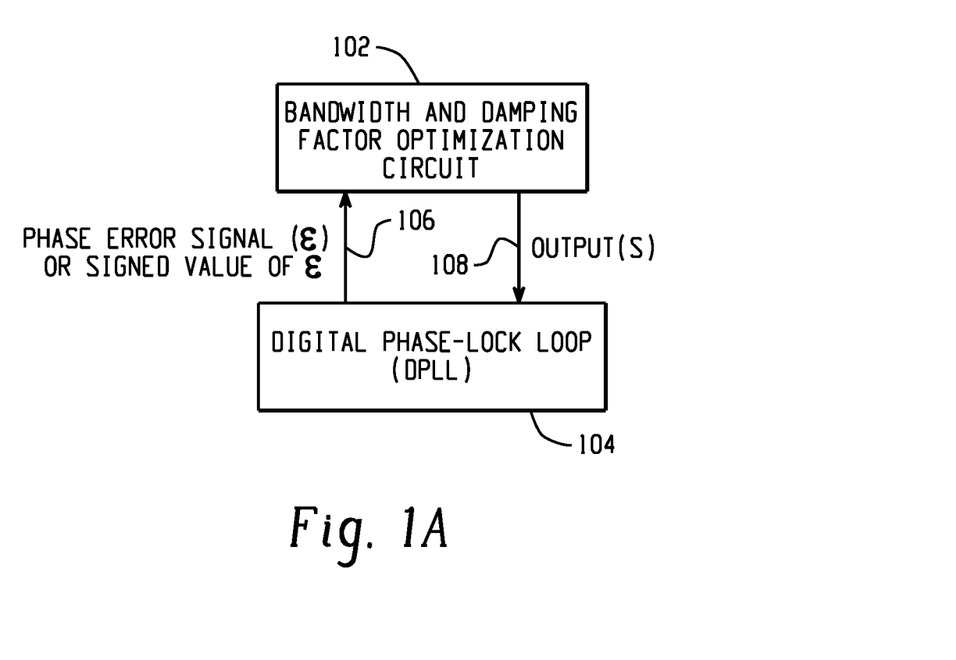
FIG. 1A depicts an example bandwidth and damping factor optimization circuit used in controlling one or more parameters of a digital phase-locked loop (DPLL), in accordance with some embodiments.

FIG. 1A depicts an example bandwidth and damping factor optimization circuit 102 used in controlling one or more parameters of a DPLL 104, in accordance with some embodiments. As shown in FIG. 1A, the bandwidth and damping factor optimization circuit 102 receives a phase error signal or a signed value of the phase error signal 106 from the DPLL 104. Based on the received signal 106, the bandwidth and damping factor optimization circuit 102 generates one or more outputs 108 for controlling parameters (e.g., coefficients, etc.) of the DPLL 104. In embodiments, the circuit 102 processes or manipulates the phase error signal or the signed value of the phase error signal 106 in order to generate the one or more outputs 108. For instance, in embodiments, the circuit 102 generates a delayed version of the signal 106 and uses the delayed version in the generating of the one or more outputs 108.

In examples, the DPLL 104 includes a current-controlled oscillator. In such examples, the one or more outputs 108 generated by the bandwidth and damping factor optimization circuit 102 control a current cell size of the current-controlled oscillator. In other examples, the DPLL 104 includes a varactor-controlled oscillator. In these other examples, the one or more outputs 108 generated by the circuit 102 control a varactor size of the varactor-controlled oscillator. Further, in examples, the DPLL 104 includes a loop filter (e.g., a digital loop filter) having a proportional path and an integral path. In such examples, the one or more outputs 108 include a first output that controls a gain of the proportional path and a second output that controls a gain of the integral path. The use of the bandwidth and damping factor optimization circuit 102 to control these gain values is discussed in greater detail below with reference to FIG. 2.

The jitter performance of the DPLL 104 depends on the bandwidth of the DPLL 104, and the bandwidth varies under process, supply voltage, and temperature (PVT) variations. In addition, the damping factor of the DPLL 104 also plays a role in controlling the jitter performance of the DPLL 104 when there is significant low-frequency noise (e.g., flicker noise and supply noise), in embodiments. Under the approaches of the instant disclosure, the one or more outputs 108 of the circuit 102 dynamically select and adjust the bandwidth and the damping factor of the DPLL 104 to optimize the jitter performance of the DPLL 104 (e.g., to minimize jitter in the output of the DPLL 104). The selection and adjustment of the bandwidth and the damping factor are not static, one-time settings, but rather occur dynamically, such that these values are changed, automatically, in response to PVT variations and other variations (e.g., variation in the amount of noise present, etc.). The approaches of the instant disclosure are in contrast to conventional approaches that do not allow for dynamic, automatic adjustment of the bandwidth and the damping factor.

Because the gain values of the proportional path and the integral path of the DPLL 104 are related to the bandwidth and the damping factor of the DPLL 104, in embodiments, the circuit 102 dynamically selects and adjusts the bandwidth and damping factor by controlling these gain values. The control of these gain values for setting the bandwidth and damping factor of the DPLL 104 is described in further detail below.

In some conventional approaches, a bandwidth of a PLL can be statically set to a user-defined setting. Such conventional approaches are deficient, however, because variations (e.g., process variation, environmental variation, and noise variation, etc.) cause the optimum bandwidth setting to vary. Thus, the static, one-time setting of the bandwidth cannot provide an optimum bandwidth setting over such variations. In other conventional approaches, the bandwidth of the PLL is dynamically adjusted (e.g., adjusted in response to process and environmental variations), but the damping factor is set to a constant value. These other conventional approaches are deficient because the constant damping factor value is not optimal for all circumstances. For instance, in some conventional approaches, a constant, high damping factor is used at all times, but it is known that a lower damping factor can help filter larger amounts of low-frequency noise of the oscillator in the DPLL. Thus, the high damping factor is suboptimal for some circumstances.

In contrast to the conventional approaches described above, the approaches of the instant disclosure enable both the bandwidth and damping factor to be set automatically (e.g., without a manual, user-defined setting) and dynamically adjusted (e.g., in response to PVT variation, noise variation, etc.). The systems and methods of the instant disclosure thus enable the optimum bandwidth and the optimum damping factor to be set, which can improve the phase noise and the jitter performance of the DPLL.

Figure 1B:
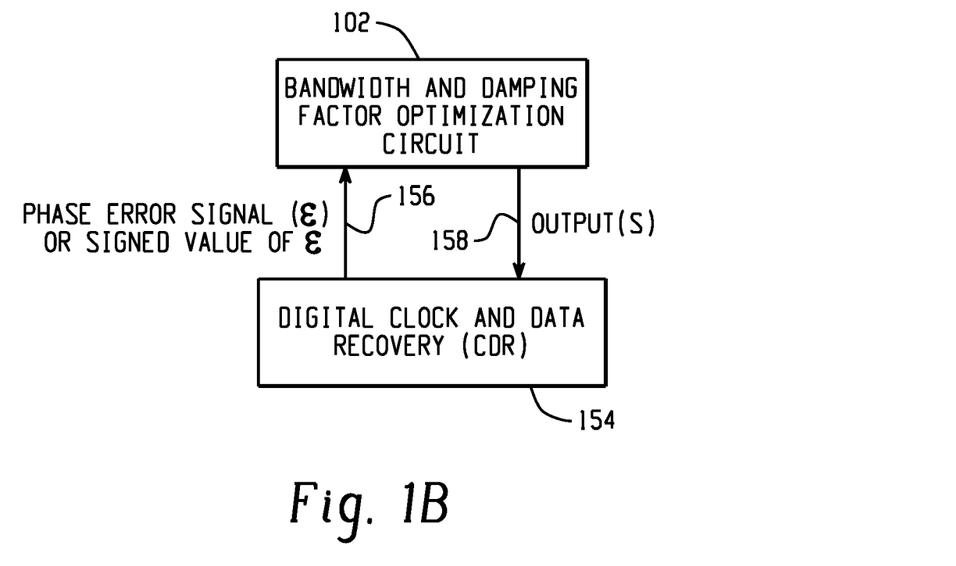
FIG. 1B depicts an example bandwidth and damping factor optimization circuit used in controlling one or more parameters of a digital clock and data recovery (CDR) circuit, in accordance with some embodiments.

In examples, the bandwidth and damping factor optimization circuit 102 is used in dynamically controlling one or more parameters of a digital clock and data recovery (CDR) circuit. To illustrate aspects of such examples, reference is made to FIG. 1B. This figure depicts the bandwidth and damping factor optimization circuit 102 coupled to a CDR 154. As shown in FIG. 1B, the bandwidth and damping factor optimization circuit 102 receives a phase error signal or a signed value of the phase error signal 156 from the CDR 154. Based on the received signal 156, the bandwidth and damping factor optimization circuit 102 generates one or more outputs 158 for controlling parameters of the CDR 154. In embodiments, the circuit 102 processes or manipulates the phase error signal or the signed value of the phase error signal 156 in order to generate the one or more outputs 158. For instance, in embodiments, the circuit 102 generates a delayed version of the signal 156 and uses the delayed version in the generating of the one or more outputs 158.

In examples, the CDR 154 includes a current-controlled oscillator. In such examples, the one or more outputs 108 generated by the bandwidth and damping factor optimization circuit 102 control a current cell size of the current-controlled oscillator. In other examples, the CDR 154 includes a varactor-controlled oscillator. In these other examples, the one or more outputs 158 generated by the circuit 102 control a varactor size of the varactor-controlled oscillator. Further, in examples, the CDR 154 includes a loop filter (e.g., a digital loop filter) having a proportional path and an integral path. In such examples, the one or more outputs 158 include a first output that controls a gain of the proportional path and a second output that controls a gain of the integral path. The use of the bandwidth and damping factor optimization circuit 102 to control these gain values is discussed in greater detail below with reference to FIG. 2.

Figure 2:
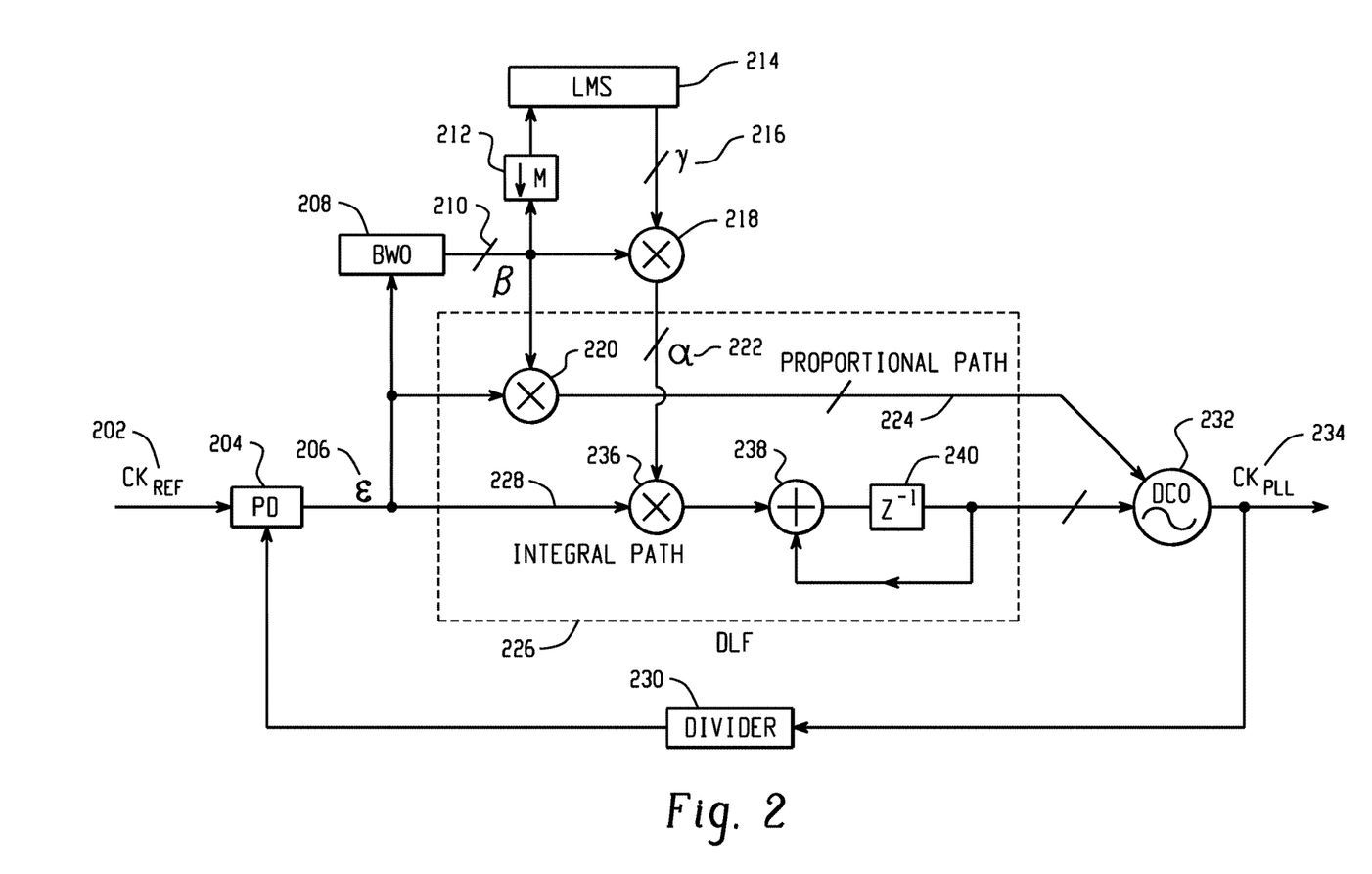
FIG. 2 is a block diagram of DPLL including components for controlling one or more parameters of the DPLL, in accordance with some embodiments.

FIG. 2 is a block diagram of DPLL including circuit components for dynamically controlling one or more parameters of the DPLL, in accordance with some embodiments. The DPLL of FIG. 2 includes a phase detector (PD) 204, a loop filter 226 (e.g., a digital loop filter (DLF)), an oscillator 232 (e.g., a digitally-controlled oscillator (DCO)), and a divider 230. Such components are conventional components of a DPLL, known to those of ordinary skill in the art. In some examples, the oscillator 232 is a current-controlled oscillator. In other examples, the oscillator 232 is a varactor-controlled oscillator. The PD 204 (e.g., a time-to-digital converter, a bang-bang (binary) phase detector, a bang-bang phase-frequency detector, etc.) generates a phase error signal $\epsilon$ 206, which represents a phase error between a reference clock 202 and an output 234 of the DPLL.

As shown in FIG. 2, the loop filter 226 is a second-order, digital loop filter having a proportional path 224 and an integral path 228. A gain value of the proportional path 224 is a beta value $\beta$ 210 received at a multiplier 220, and a gain value of the integral path is an alpha value $\alpha$ 222 received at a multiplier 236. In examples, the gain values $\beta$ 210 and $\alpha$ 222 control parameters (e.g., noise bandwidth, damping factor) of the DPLL. Thus, as described herein, components of the circuit shown in FIG. 2 (e.g., the bandwidth optimization circuit 208, down-sampling circuit 212, and filter 214, described in detail below) dynamically select and adjust the bandwidth and damping factor of the DPLL by controlling the gain values β 210 and α 222.

The proportional path 224 of the loop filter 226 includes the multiplier 220, and a signal on the proportional path 224 represents the phase error signal ε 206 scaled by the gain value β 210. The signal on the proportional path 224 is provided as a first input to the oscillator 232. The integral path 228, utilizing adder element 238, accumulates successively received digital data signal samples into an integral register 240. The accumulated value is provided as a second input to the oscillator 232.

As noted above, components of the circuit shown in FIG. 2 dynamically select and adjust the bandwidth and damping factor of the DPLL by controlling the gain values β 210 and α 222. These components include a bandwidth optimization (BWO) circuit 208, a down-sampling circuit 212 (e.g., M-slow down-sampling circuit), and a filter 214. In examples, the filter 214 is a least-mean-square adaptive filter, a signed least-mean-square adaptive filter, or a signed-signed least-mean-square adaptive filter. As described in further detail below, the BWO circuit 208 is configured to dynamically optimize the proportional gain value β 210, and the filter 214 is configured to dynamically optimize the integral gain value α 222.

By optimizing the gain values β 210 and α 222 in a dynamic, automatic manner, the phase noise and the jitter performance of the DPLL is optimized across different process, supply voltage, and temperature (PVT) conditions and different environmental conditions (e.g., noise, etc.). The selection and adjustment of the gain values β 210 and α 222 are not static, one-time settings, but rather occur dynamically, such that these values are changed, automatically, in response to PVT variations or other variations (e.g., variation in the amount of noise present, etc.). The dynamic adjustment of the gain values β 210 and α 222 is described in further detail below.

Figure 3A:
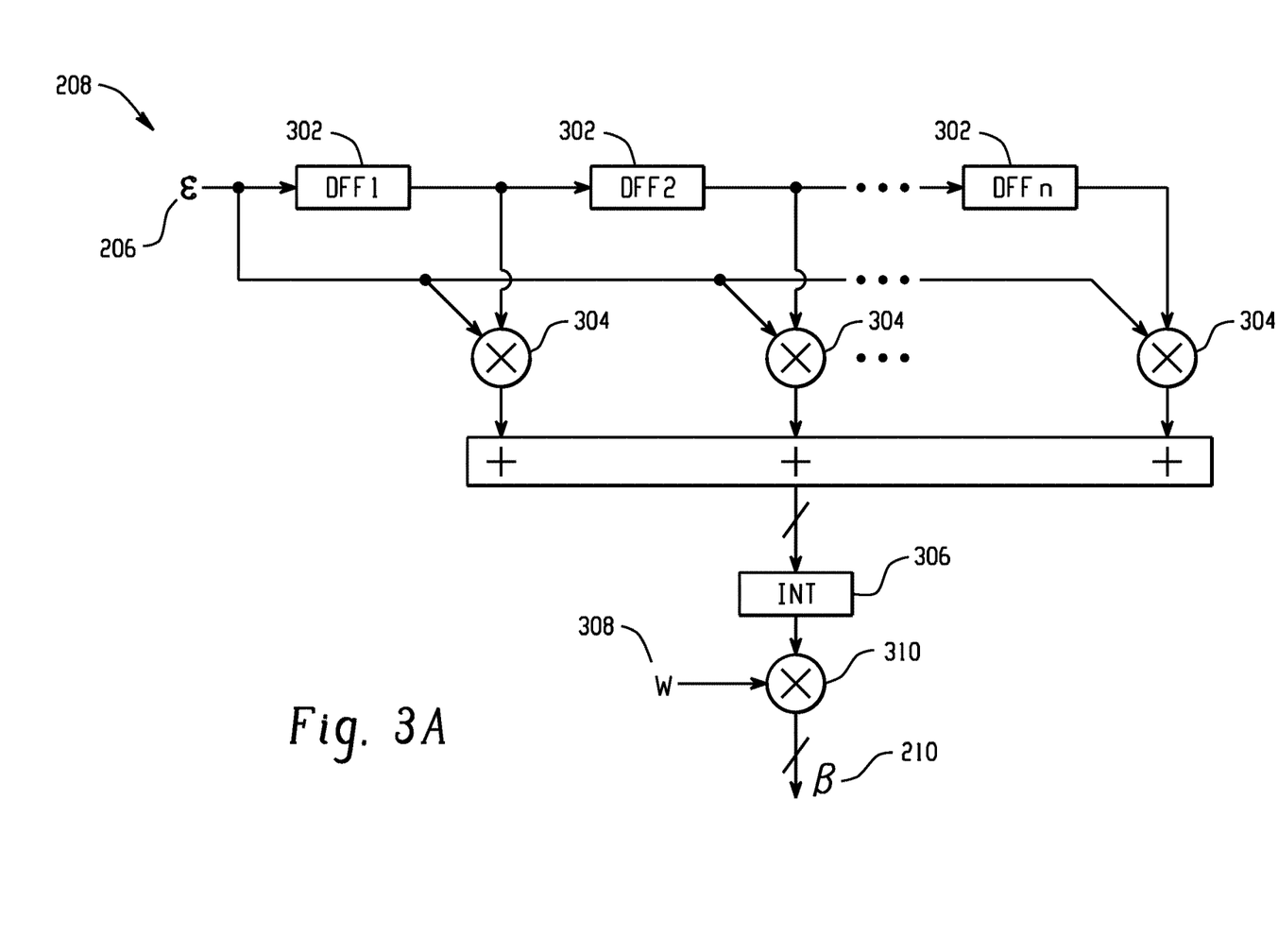
FIG. 3A is a block diagram of the bandwidth optimization circuit (BWO) of FIG. 2, in accordance with some embodiments.

FIG. 3A is a block diagram of the BWO circuit 208 of FIG. 2, in accordance with some embodiments. The BWO circuit 208 is configured to integrate a product of the phase error signal ε 206 and a delayed version of the phase error signal ε 206, in examples. Further, in examples where the filter 214 is a signed least-mean-square adaptive filter or a signed-signed least-mean-square adaptive filter, the BWO circuit 208 is configured to integrate a product of a signed value of the phase error signal ε 206 and a delayed version of the signed value of the phase error signal ε 206.

To perform the above-described functions, the BWO circuit 208 includes one or more delay elements 302 (e.g., one or more D flip-flop stages utilized to provide a delay), one or more multipliers 304, a multiplier 310, and an integrator 306. In the example of FIG. 3A, for each of the one or more delay elements 302, there is a corresponding multiplier of the one or more multipliers 304, as shown in the figure. The error signal ε 206 is fed to the one or more delay elements 302, and delayed error signals are provided at outputs of the one or more delay elements 302. Each of the one or more multipliers 304 generates a product of the error signal ε 206 and a delayed version of the error signal. The one or more products generated by the one or more multipliers 304 are integrated by the integrator 306. The resulting integrated value that is output by the integrator 306 is scaled at the multiplier 310 by a factor w 308 to generate the gain value β 210. In embodiments, the factor w 308 is smaller than 1, which determines the locking speed. A larger w 308 provides faster locking, but the disturbance of β 210 becomes larger. In some examples, w 308 is set to 1/256. An equation for the gain value β 210 is as follows:

$$\beta_k = \beta_{k-1} + w \cdot (\epsilon_k \cdot \epsilon_{k-D} + \epsilon_k \cdot \epsilon_{k-D-1} + \epsilon_k \cdot \epsilon_{k-D-2} \cdots + \epsilon_k \cdot \epsilon_{k-D-n}),$$ (Equation 1)

where the subscript k denotes the iteration cycle and D denotes the delayed time. It is noted that in examples where the filter 214 is a signed least-mean-square adaptive filter or a signed-signed least-mean-square adaptive filter, the one or more delay elements 302 are configured to receive a signed value of the phase error signal error signal ε 206 and generate a delayed version of the signed value of the phase error signal error signal ε 206. Thus, in these examples, the BWO circuit 208 integrates the product of the signed value of the phase error signal ε 206 and the signed value of the delayed phase error signal ε 206.

With reference again to FIG. 2, the sequence of β 210 is down-sampled by the down-sampling circuit 212 to β'. Down-sampling is performed by the circuit 212 to wait for each β 210 value changing in response to the change of γ 216. It is noted that it is not necessary to wait for β 210 to fully settle, but it can be advantageous to know the tendency of the change of β 210 due to a different γ 216 value. The filter 214 receives the down-sampled output (i.e., β') from the down-sampling circuit 212 and generates a gamma value γ 216 that minimizes a value β'. Thus, under the approaches of the instant disclosure, the error signal ε 206 is whitened using a minimum β' value. A white signal means that the signal has no obvious periodicity, and the change of the signal occurs in both high frequency and low frequency schemes. For instance, the polarity of ε 206 can be positive or negative. If ε 206 is whitened, the sign value of ε 206 alternates between positive and negative in random, and furthermore the sign value of ε 206 changes sometimes frequently but sometimes slowly.

The values β 210 and γ 216 are received at the multiplier 218, and the output of the multiplier 218 is the gain value of the integral path 228, i.e., the alpha value α 222. It is thus noted that γ=α/β. The corresponding equation for the gamma value γ 216 is $$\gamma_{i+1} = \gamma_i - \mu \cdot (\beta'_i - \beta'_{i-1}) / (\gamma_i - \gamma_{i-1}),$$ (Equation 2)

or $$\gamma_{i+1} = \gamma_i - \mu \cdot (\beta'_i - \beta'_{i-1}) \cdot \text{sgn}(\gamma_i - \gamma_{i-1}),$$ (Equation 3)

or $$\gamma_{i+1} = \gamma_i - \mu \cdot \text{sgn}(\beta'_i - \beta'_{i-1}) \cdot (\gamma_i - \gamma_{i-1}),$$ (Equation 4)

or $$\gamma_{i+1} = \gamma_i - \mu \cdot \text{sgn}(\beta'_i - \beta'_{i-1}) \cdot \text{sgn}(\gamma_i - \gamma_{i-1}).$$ (Equation 5)

where μ is a positive coefficient, the subscript i denotes the iteration cycle, and sgn(*) is a sign function (e.g., sgn(>0)=1 or sgn(<0)=−1). It is noted that each of Equations 2-5 is suitable for any case. However, because using only sign values can reduce circuit complexity, Equation 5 may be simplest to implement in a circuit. Note that the subscript i is an M-slow iteration cycle with respective to the subscript k (e.g., β'$_i$=β$_{M \cdot k}$). The M-slow operation for the filter 214 aims at waiting for the change of β 210 in response to a different γ 216, since the filter 214 should give the next γ 216 value after evaluating the change of β 210 (e.g., as shown in the above Equations 2-5).

As noted above, the value β 210 is the gain of the proportional path 224 of the DPLL, and the value α 222 is the gain of the integral path 228. Under the approaches of the instant disclosure (e.g., as implemented in the embodiment of FIGS. 2 and 3A via the BWO circuit 208, down-sampling circuit 212, and filter 214), these values β 210 and α 222 are automatically selected and dynamically adjusted, as described above. Because the gain values of the proportional path 224 and the integral path 228 of the DPLL are related to the bandwidth and the damping factor of the DPLL, in embodiments, the components 208, 212, 214 shown in FIGS. 2 and 3A automatically select and dynamically adjust the DPLL's bandwidth and damping factor by controlling the gain values β 210 and α 222. Specifically, the DPLL's bandwidth is approximated as $$\text{Bandwidth} \cong \frac{K}{2\pi T_r}, \qquad \text{(Equation 6)}$$

where Tr is the period of the reference clock 202, and $K=K_{PD}N\beta K_T$, with $K_{PD}$ being a gain of the phase detector 204, N being the division ratio of the divider 230, and $K_T$ being the period gain of the oscillator 232. The DPLL's damping factor is given by $$\text{Damping factor} = \frac{1}{2}\sqrt{\frac{K}{\gamma}} = \frac{1}{2}\sqrt{\frac{\beta}{\alpha}K}. \qquad \text{(Equation 7)}$$

As is evident from Equations 6 and 7, the bandwidth and damping factor of the DPLL are dependent on the gain values β 210 and α 222. Thus, under the approaches of the instant disclosure, proper values for β 210 and α 222 are automatically determined in a manner that optimizes the bandwidth and the damping factor to achieve the best jitter performance across PVT variations and other variations.

Figure 3B:
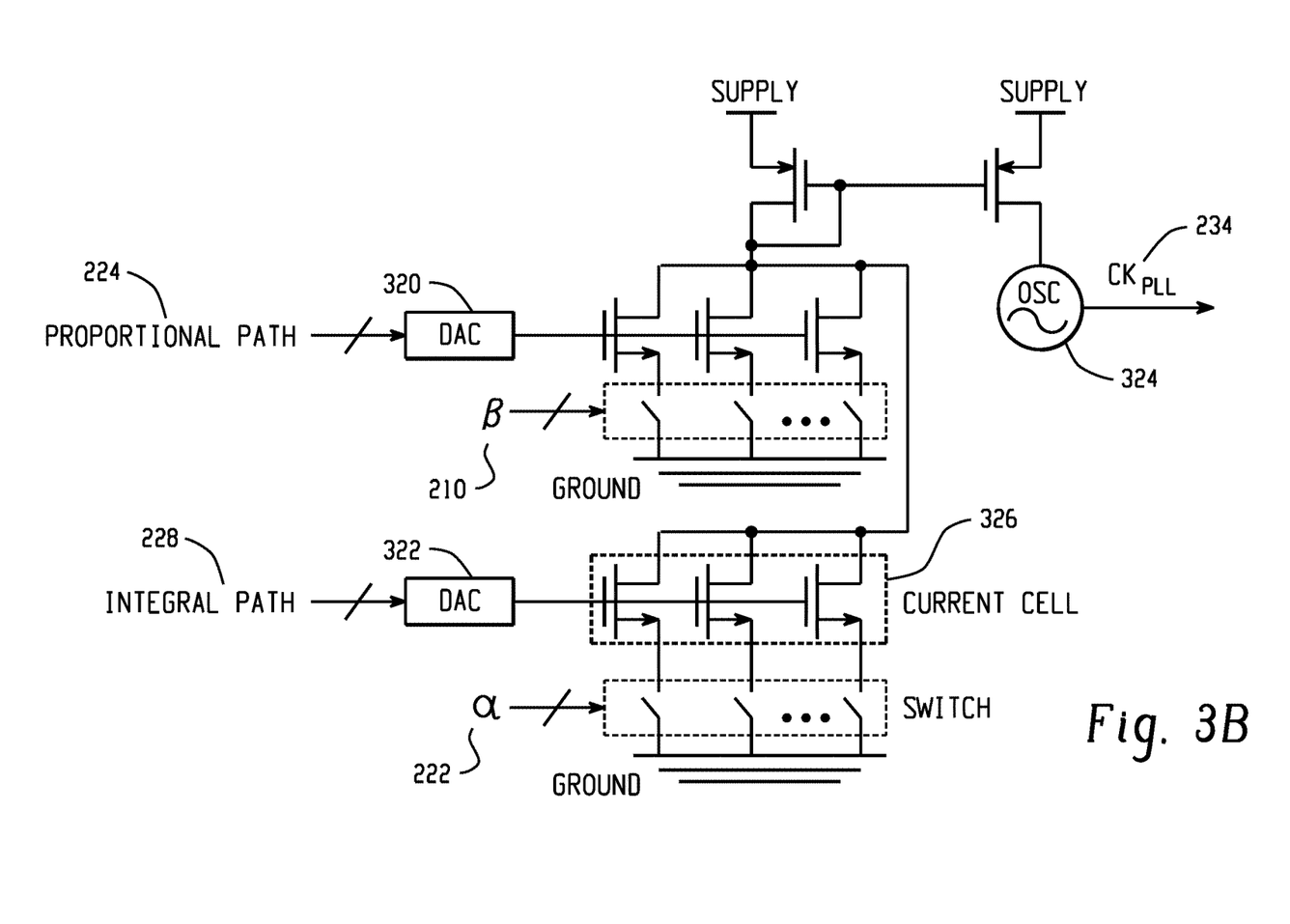
FIG. 3B depicts a current-controlled oscillator with a current cell, in accordance with some embodiments.

In examples, the oscillator 232 is a current-controlled oscillator. In such examples, the β 210 and γ 216 values generated by the BWO circuit 208 and the filter 214, respectively, control a size of a current cell of the current-controlled oscillator. To illustrate these examples, reference is made to FIG. 3B. This figure depicts a current-controlled oscillator with a current cell 326. A control signal from the proportional path 224 of the DLF 226 is converted to an analog signal by a digital-to-analog converter (DAC) 320. Likewise, a control signal from the integral path 228 is converted to analog signal by a DAC 322. These signals from the respective DACs 320, 322 control the current of the oscillator (OSC) 324. In this example, larger voltages output by the DACs 320, 322 give rise to a larger current of the OSC 324, and the current of the OSC 324 is proportional to the voltages by a proportional factor. The proportional factor is controlled by the gain coefficient (e.g., β 210 or α 222) by changing the size of the current cell 326.

Figure 3C:
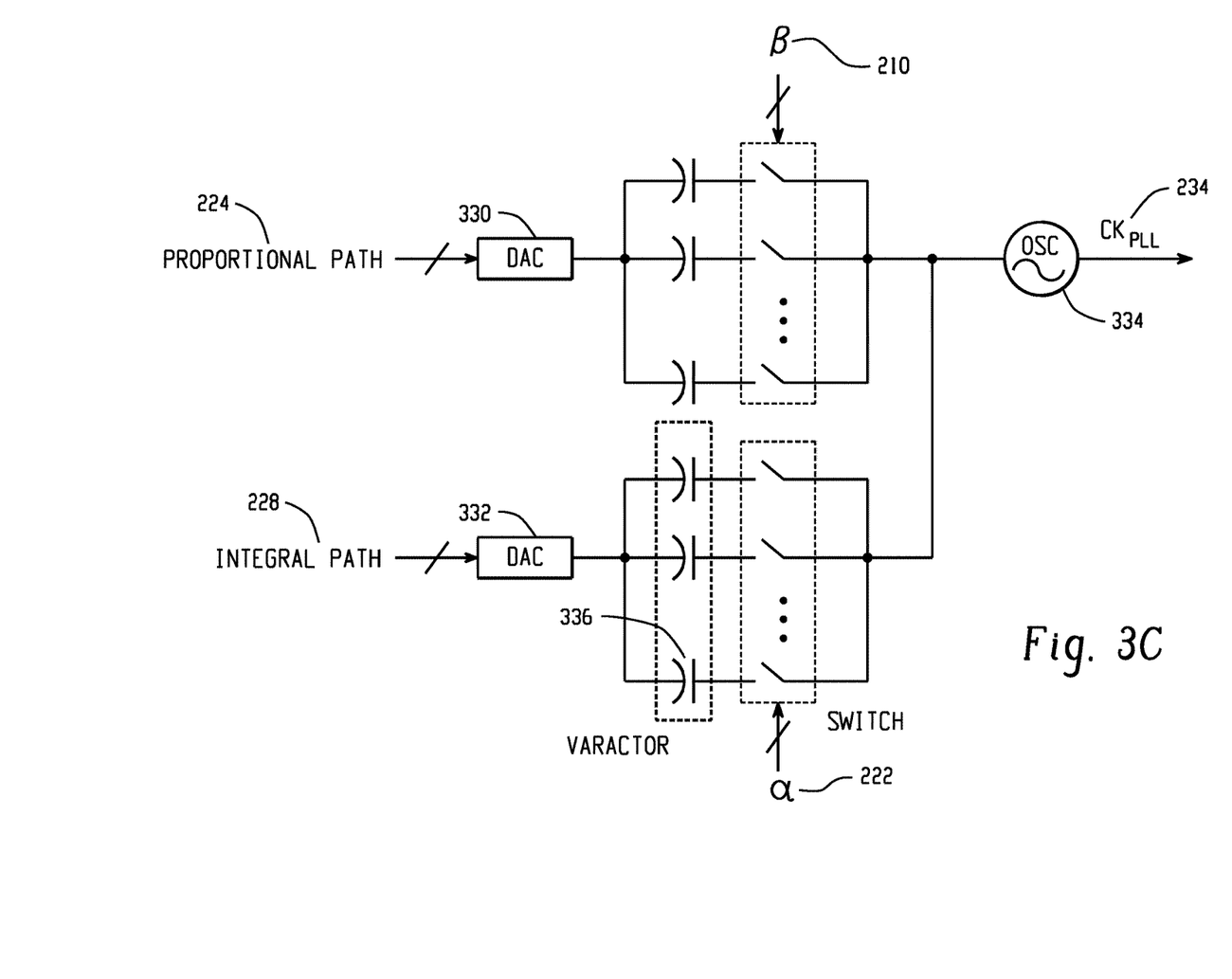
FIG. 3C depicts a varactor-controlled oscillator, in accordance with some embodiments.

In other examples, the oscillator 232 is a varactor-controlled oscillator. In these other examples, the β 210 and γ 216 values generated by the BWO circuit 208 and the filter 214, respectively, control a varactor size of the varactor-controlled oscillator. To illustrate these other examples, reference is made to FIG. 3C. This figure depicts a varactor-controlled oscillator including a varactor 336. A control signal from the proportional path 224 of the DLF 226 is converted to an analog signal by a DAC 330. Likewise, a control signal from the integral path 228 is converted to analog signal by a DAC 332. These signals from the respective DACs 330, 332 control the varactor 336 of the oscillator (OSC) 334. In this example, the capacitance of the varactor 336 is proportional to the voltages output by the DACs 330, 332 by a proportional factor. The proportional factor is controlled by the gain coefficient (e.g., β 210 or α 222) by changing the size of the varactor 336.

Figure 3D:
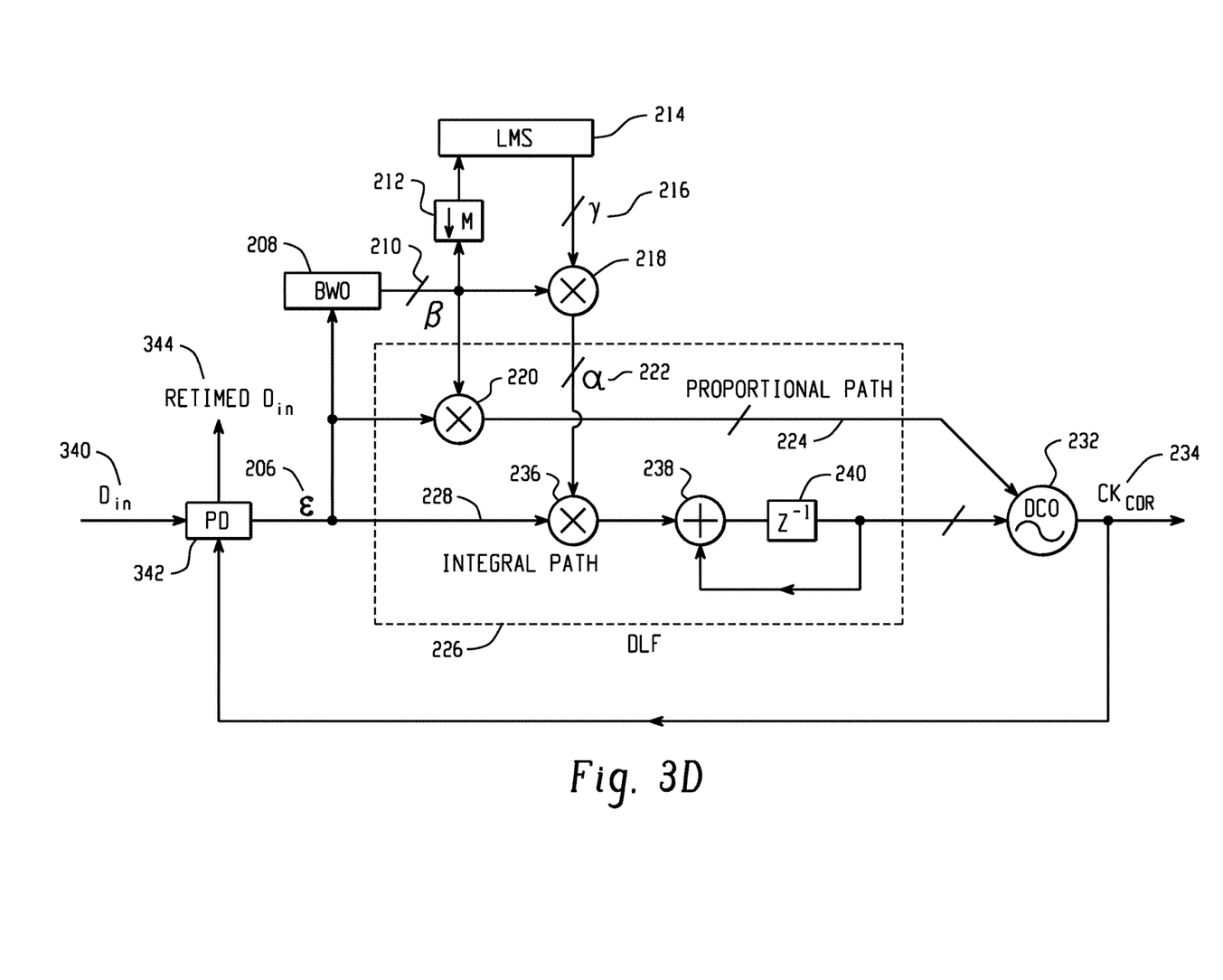
FIG. 3D is a block diagram of clock and data recovery (CDR) circuit including components for controlling one or more parameters of the CDR circuit, in accordance with some embodiments.

It is further noted that although aspects of the instant disclosure are explained in the context of a DPLL, the circuits and operations are equally applicable for optimizing bandwidth and damping factor in digital clock and data recovery (CDR) circuits and digital delay-locked loop circuits. For example, FIG. 3D illustrates use of an example circuit for controlling parameters of a CDR. The circuit of FIG. 3D is similar to that of FIG. 2 and includes components that are the same as or similar to those utilized in FIG. 2. For brevity, the descriptions of these components are not repeated here. In contrast to the DPLL embodiment shown in FIG. 2, in the example of FIG. 3D, the reference clock is replaced by input data (Din) 340. Further, the phase detector 342 of FIG. 3D differs from the phase detector 204 of FIG. 2 and provides a retimed data (retimed Din) output 344, which is not generated by the phase detector 204 of FIG. 2. In embodiments, the phase detector 342 is an Alexandra phase detector which gives only the sign value of the phase error. Other types of phase detectors are used in other examples.

Figure 3E:
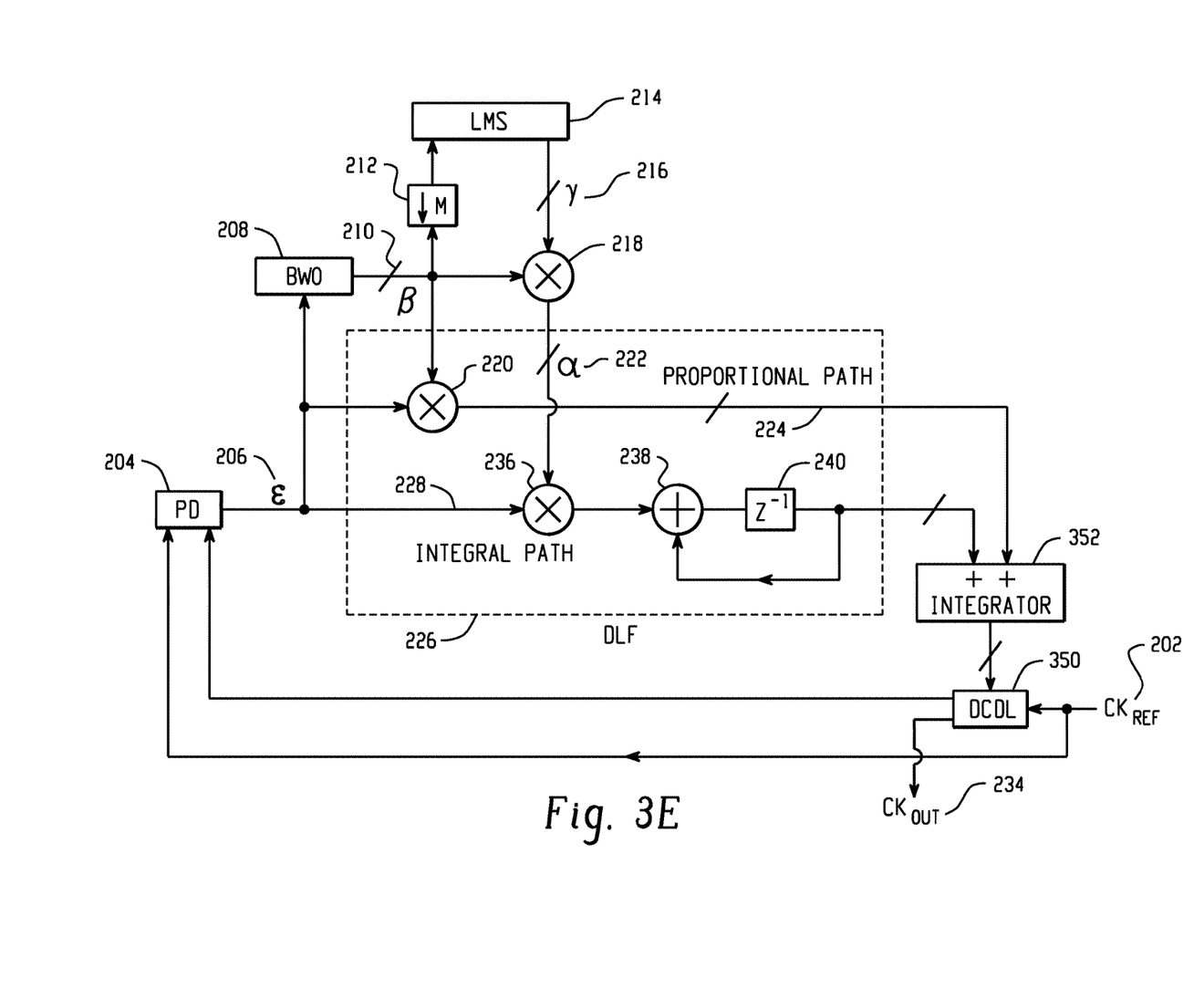
FIG. 3E is a block diagram of delay-locked loop circuit including components for controlling one or more parameters of the delay-locked loop circuit, in accordance with some embodiments.

FIG. 3E illustrates use of the circuits and operations described herein for controlling parameters of a delay-locked loop circuit. The circuit of FIG. 3E is similar to that of FIG. 2 and includes components that are the same as or similar to those utilized in FIG. 2. For brevity, the descriptions of these components are not repeated here. In contrast to the DPLL embodiment shown in FIG. 2, in the example of FIG. 3E, there is no DCO but instead a digitally-controlled delay line 350. Further, in FIG. 3E, an integrator 352 sums the proportional path 224 and the integral path 228 of the DLF 226 and integrates this summation.

Figure 4:
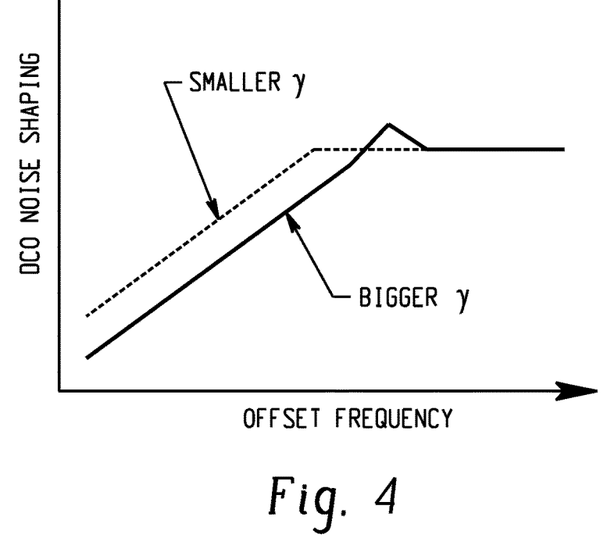
FIG. 4 is a graph depicting a transfer function from a digitally-controlled oscillator to a DPLL output, in accordance with some embodiments.
Figure 5:
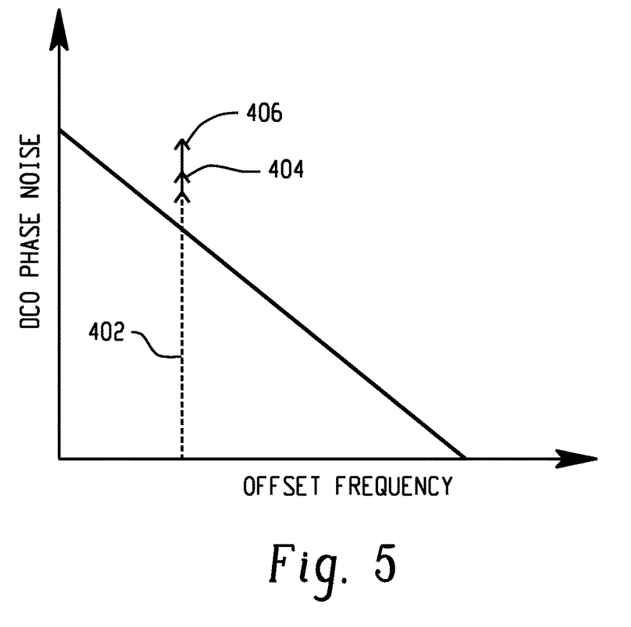
FIG. 5 is a graph depicting three examples with different amounts of supply noise, in accordance with some embodiments.

FIG. 4 is a graph depicting a transfer function from a digitally-controlled oscillator to a DPLL output, in accordance with some embodiments. In examples, an optimum damping factor to minimize the output jitter of a DPLL is related to a low-frequency noise profile at the oscillator 232. As illustrated in FIG. 4, using a smaller gamma value γ 216 can filter more low-frequency noise. To illustrate the effect of low-frequency noise in selecting an optimal gamma value γ 216, three examples are illustrated in FIGS. 5-11B. The phase noise profiles of the oscillator 232 for these three examples are shown in FIG. 5. As shown in this figure, a first example 402 has a lowest amount of supply noise, a third example 406 has a highest amount of supply noise, and a second example 404 has an amount of supply noise between the amounts of the first and third examples.

Figure 6:
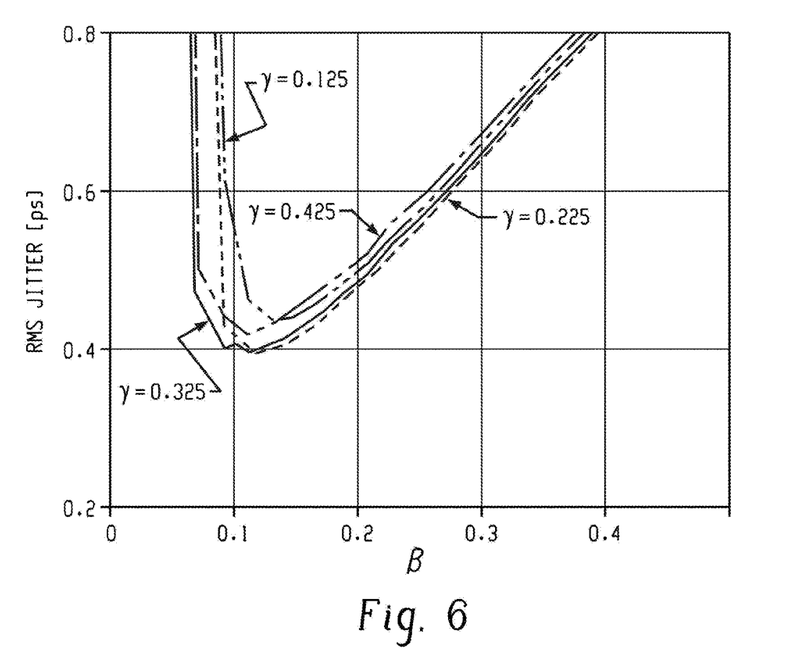
FIG. 6 is a graph showing RMS jitter versus $\beta$ with different $\gamma$ values for the first example of FIG. 5, in accordance with some embodiments.
Figure 7A:
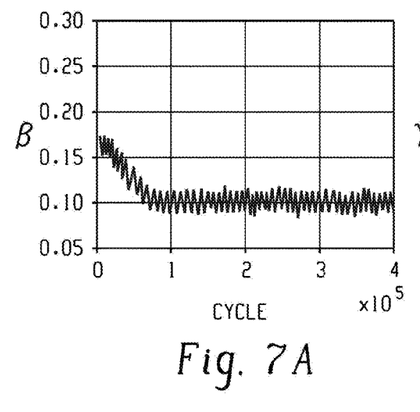
FIGS. 7A and 7B depict transient response of $\beta$ and $\gamma$ values for the first example of FIG. 5, in accordance with some embodiments.
Figure 7B:
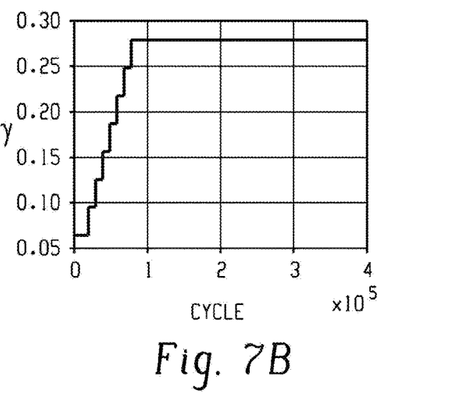

FIG. 6 is a graph showing root-mean-squared (RMS) jitter versus β with different γ values of the first example of FIG. 5, in accordance with some embodiments. As noted above, in the first example, the low-frequency noise is relatively small. The curves shown in FIG. 6 are obtained via simulations, in examples. From these curves, it can be seen that to optimize jitter performance, the optimum γ value is between 0.225 and 0.328, and the optimum β value is near 0.1. FIGS. 7A and 7B show example transient response output curves obtained using the systems and methods described herein (e.g., using the circuits shown in FIGS. 2 and 3A, etc.) for the first example. The final β 210 (e.g., approximately equal to 0.1) and γ 216 (e.g., approximately equal to 0.28) values are determined automatically using the systems and methods of the instant disclosure. As shown in FIGS. 7A and 7B, the determined values of β 210 and γ 216 agree with the optimal β and γ values from the simulations.

Figure 8:
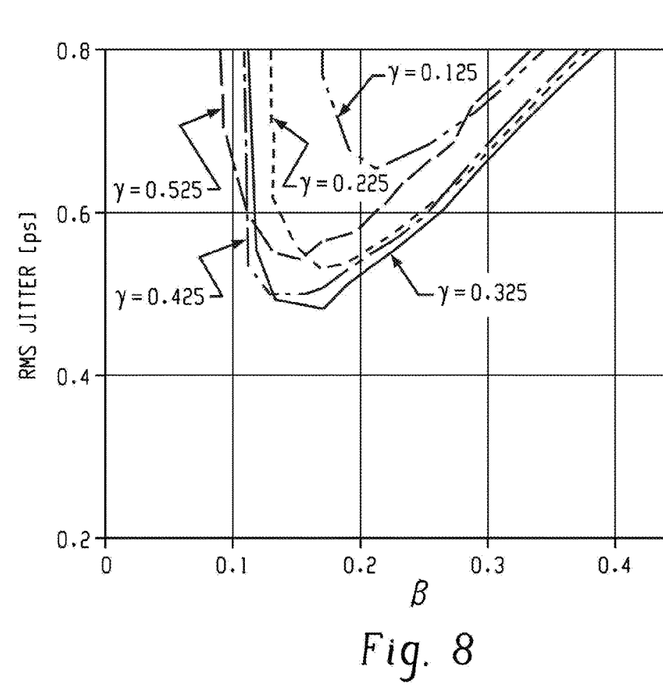
FIG. 8 is a graph showing RMS jitter versus $\beta$ with different $\gamma$ values for the second example of FIG. 5, in accordance with some embodiments.
Figure 9A:
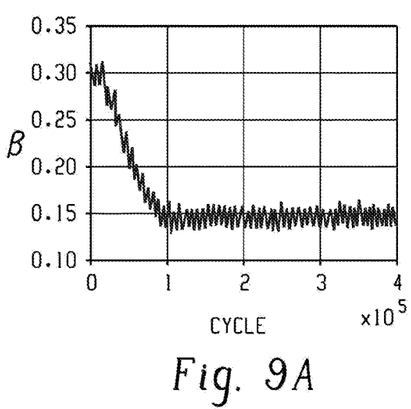
FIGS. 9A and 9B depict transient response of $\beta$ and $\gamma$ values for the second example of FIG. 5, in accordance with some embodiments.
Figure 9B:
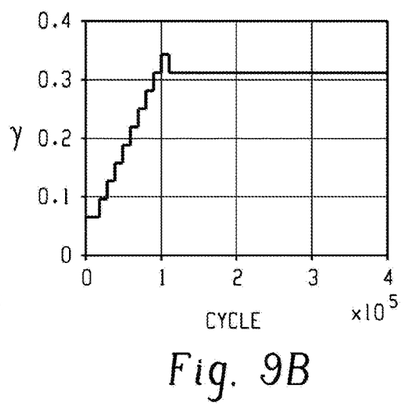

FIG. 8 is a graph showing RMS jitter versus β with different γ values for the second example of FIG. 5, in accordance with some embodiments. As noted above, the second example has an amount of supply noise that is between the amounts of the first and third examples described herein. The curves shown in FIG. 8 are obtained via simulations, in examples. From these curves, it can be seen that to minimize RMS jitter, the optimum γ value is approximately equal to 0.325, and the optimum β value is approximately equal to 0.1. FIGS. 9A and 9B show example transient response output curves obtained using the systems and methods described herein for the second example. The final β 210 and γ 216 values are determined automatically using the systems and methods of the instant disclosure. As shown in FIGS. 9A and 9B, the determined values of β 210 and γ 216 agree with the optimal β and γ values from the simulations.

Figure 10:
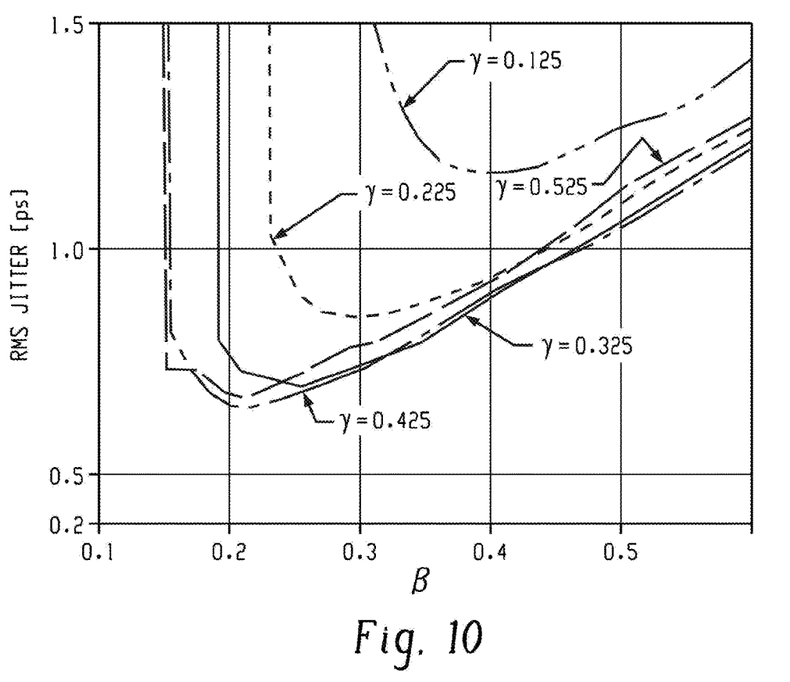
FIG. 10 is a graph showing RMS jitter versus $\beta$ with different $\gamma$ values for the third example of FIG. 5, in accordance with some embodiments.
Figure 11A:
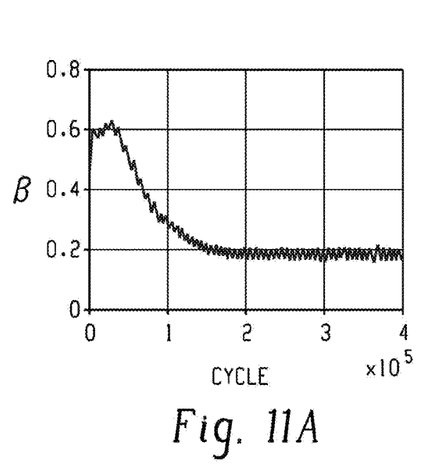
FIGS. 11A and 11B depict transient response of $\beta$ and $\gamma$ values for the third example of FIG. 5, in accordance with some embodiments.
Figure 11B:
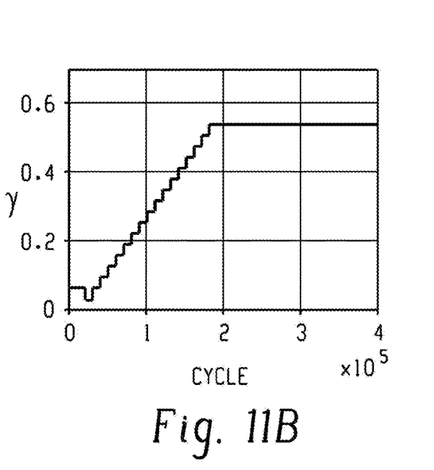

FIG. 10 is a graph showing RMS jitter versus β with different γ values for the third example of FIG. 5, in accordance with some embodiments. As noted above, the third example has the highest amount of low-frequency noise of the three examples described herein. The curves shown in FIG. 10 are obtained via simulations, in examples. From these curves, it can be seen that to minimize RMS jitter, the optimum γ value is approximately equal to 0.525, and the optimum β value is approximately equal to 0.2. FIGS. 11A and 11B show example transient response output curves obtained using the systems and methods described herein for the third example. The final β 210 and γ 216 values are determined automatically using the systems and methods of the instant disclosure. As shown in FIGS. 11A and 11B, the determined values of β 210 and γ 216 agree with the optimal β and γ values from the simulations.

Figure 12:
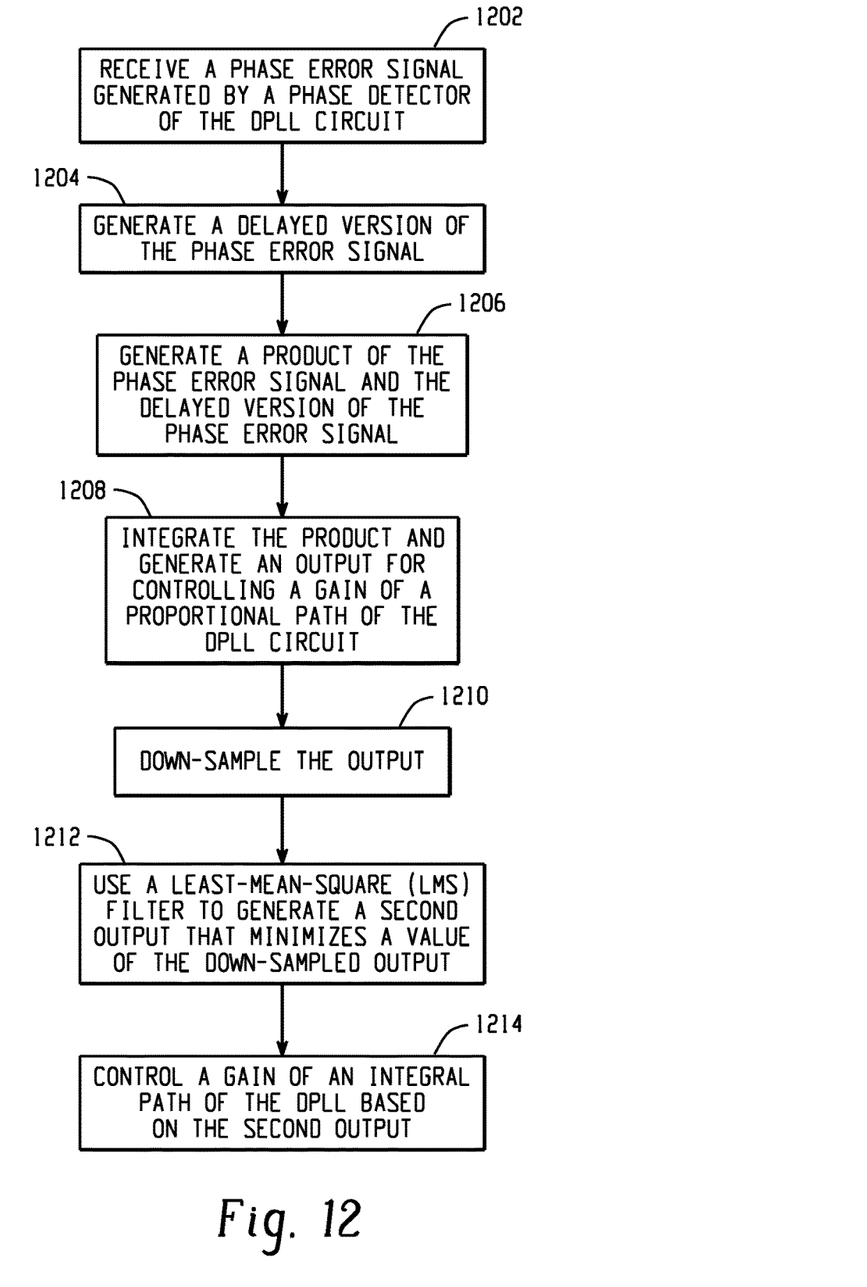
FIG. 12 depicts operations of an example method for automatically controlling one or more parameters of a digital phase-locked loop circuit, in accordance with some embodiments.

FIG. 12 depicts operations of an example method for automatically controlling one or more parameters of a digital phase-locked loop circuit, in accordance with some embodiments. At 1202, a phase error signal generated by a phase detector of the DPLL circuit is received. At 1204, a delayed version of the phase error signal is generated. At 1206, a product of the phase error signal and the delayed version of the phase error signal is generated. At 1208, the product is integrated, and an output for controlling a gain of a proportional path of the DPLL circuit is generated based on the integrated product. At 1210, the output is down-sampled. At 1212, a least-mean-square (LMS) filter is used to generate a second output that minimizes a value of the down-sampled output. At 1214, a gain of an integral path of the DPLL is controlled based on the second output.

The present disclosure is directed to systems and methods for automatically controlling one or more parameters of a digital phase-locked loop circuit. An example circuit includes a first circuit configured to integrate a product of a phase error signal and a delayed version of the phase error signal. The example circuit also includes a down-sampling circuit configured to down-sample a first output of the first circuit, the first output being based on the integrated product. The example circuit also includes a filter configured to receive the down-sampled output from the down-sampling circuit and generate a second output that minimizes a value of the down-sampled output.

Another example circuit includes a first circuit configured to integrate a product of a signed value of a phase error signal and a delayed version of the signed value of the phase error signal. The example circuit also includes a down-sampling circuit configured to down-sample a first output of the first circuit, the first output being based on the integrated product. The example circuit further includes a filter configured to receive the down-sampled output from the down-sampling circuit and generate a second output that minimizes a value of the down-sampled output.

In an example method for automatically controlling one or more parameters of a digital phase-locked loop circuit, a phase error signal generated by a phase detector of the DPLL circuit is received. A delayed version of the phase error signal is generated. A product of the phase error signal and the delayed version of the phase error signal is generated. The product is integrated, and a first output for controlling a gain of a proportional path of the DPLL circuit is generated based on the integrated product. The first output is down-sampled. A least-mean-square (LMS) filter is used to generate a second output that minimizes a value of the down-sampled output. A gain of an integral path of the DPLL is controlled based on the second output.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
   a first circuit configured to integrate a product of a phase error signal and a delayed version of the phase error signal;
   a down-sampling circuit configured to down-sample a first output of the first circuit, the first output being based on the integrated product; and
   a filter configured to receive the down-sampled output from the down-sampling circuit and generate a second output that minimizes a value of the down-sampled output.

2. The circuit of claim 1, wherein the filter is a least-mean-square adaptive filter, a signed least-mean-square adaptive filter, or a signed-signed least-mean-square adaptive filter.

3. The circuit of claim 1, further comprising:
   a digital-phase-locked loop (DPLL) including a current-controlled oscillator, wherein the first output and the second output control a current cell size of the oscillator.

4. The circuit of claim 1, further comprising:
   a digital-phase-locked loop (DPLL) including a varactor-controlled oscillator, wherein the first output and the second output control a varactor size of the oscillator.

5. The circuit of claim 1, further comprising:
   a digital-phase-locked loop (DPLL) including (i) a phase detector configured to generate the phase error signal, and (ii) a loop filter including a proportional path and an integral path, wherein the first output generated by the first circuit controls a gain of the proportional path, and wherein the second output generated by the filter controls a gain of the integral path.

6. The circuit of claim 5, further comprising:
   a multiplier configured to (i) receive the first output generated by the first circuit and the second output generated by the filter, and (ii) generate a product of the first output and the second output, wherein the product of the first output and the second output controls the gain of the integral path.

7. The circuit of claim 1, wherein the first circuit comprises:
one or more delay elements configured to receive the phase error signal and generate the delayed version of the phase error signal;
a multiplier configured to generate the product of the phase error signal and the delayed version of the phase error signal; and
an integrator configured to integrate the product of the phase error signal and the delayed version of the phase error signal.

8. The circuit of claim 1, further comprising:
a digital clock and data recovery circuit (CDR) including a current-controlled oscillator, wherein the first output and the second output control a current cell size of the oscillator.

9. The circuit of claim 1, further comprising:
a digital clock and data recovery circuit (CDR) including a varactor-controlled oscillator, wherein the first output and the second output control a varactor size of the oscillator.

10. The circuit of claim 1, further comprising:
a digital clock and data recovery circuit (CDR) having a loop filter including a proportional path and an integral path, wherein the first output generated by the first circuit controls a gain of the proportional path, and wherein the second output generated by the filter controls a gain of the integral path.

11. A circuit comprising:
a first circuit configured to integrate a product of a signed value of a phase error signal and a delayed version of the signed value of the phase error signal;
a down-sampling circuit configured to down-sample a first output of the first circuit, the first output being based on the integrated product; and
a filter configured to receive the down-sampled output from the down-sampling circuit and generate a second output that minimizes a value of the down-sampled output.

12. The circuit of claim 11, wherein the filter is a signed least-mean-square adaptive filter or a signed-signed least-mean-square adaptive filter.

13. The circuit of claim 11, further comprising:
a digital-phase-locked loop (DPLL) including a current-controlled oscillator, wherein the first output and the second output control a current cell size of the oscillator.

14. The circuit of claim 11, further comprising:
a digital-phase-locked loop (DPLL) including a varactor-controlled oscillator, wherein the first output and the second output control a varactor size of the oscillator.

15. The circuit of claim 11, further comprising a digital-phase-locked loop (DPLL) including (i) a phase detector configured to generate the phase error signal, and (ii) a loop filter including a proportional path and an integral path, wherein the first output generated by the first circuit controls a gain of the proportional path, and wherein the second output generated by the filter controls a gain of the integral path.

16. The circuit of claim 11, wherein the first circuit comprises:
one or more delay elements configured to receive the signed value of the phase error signal and generate the delayed version of the signed value of the phase error signal;
a multiplier configured to generate the product; and
an integrator configured to integrate the product.

17. The circuit of claim 11, further comprising:
a digital clock and data recovery circuit (CDR) including a current-controlled oscillator, wherein the first output and the second output control a current cell size of the oscillator.

18. The circuit of claim 11, further comprising:
a digital clock and data recovery including a varactor-controlled oscillator, wherein the first output and the second output control a varactor size of the oscillator.

19. The circuit of claim 11, further comprising:
a digital clock and data recovery having a loop filter including a proportional path and an integral path, wherein the first output generated by the first circuit controls a gain of the proportional path, and wherein the second output generated by the filter controls a gain of the integral path.

20. A method for automatically controlling one or more parameters of a digital phase-locked loop (DPLL) circuit:
receiving a phase error signal generated by a phase detector of the DPLL circuit;
generating a delayed version of the phase error signal;
generating a product of the phase error signal and the delayed version of the phase error signal;
integrating the product and generating a first output for controlling a gain of a proportional path of the DPLL circuit based on the integrated product;
down-sampling the first output;
using a least-mean-square (LMS) filter to generate a second output that minimizes a value of the down-sampled output; and
controlling a gain of an integral path of the DPLL based on the second output.

* * * * *